United States Patent [19]

Yenawine et al.

[11] 4,282,597
[45] Aug. 4, 1981

[54] METAL-COATED PLASTIC HOUSING FOR ELECTRONIC COMPONENTS AND THE METHOD OF MAKING SAME

[75] Inventors: David L. Yenawine, Richardson; Richard K. Lowder, Carrollton; Delwin L. Power, Howe; Tommy L. Summers, Richardson, all of Tex.

[73] Assignee: Texas Instruments Incorporated, Dallas, Tex.

[21] Appl. No.: 855,513

[22] Filed: Nov. 28, 1977

[51] Int. Cl.³ .................... G04B 37/00; G02G 13/08
[52] U.S. Cl. ................................. 368/280; 174/52 R
[58] Field of Search .......... 58/88 R, 91, 23 R, 23 BA, 58/50 R, 52 R, 55; 429/98; 29/177, 179; 361/212, 216, 220, 380, 392, 393, 394, 395; 174/50.5, 52 R, 52 S, 52 FP, 35 R, 35 MS; 206/328, 331

[56] References Cited

U.S. PATENT DOCUMENTS

| | | | |
|---|---|---|---|
| 1,875,968 | 9/1932 | Weeber | 174/35 R |
| 3,572,499 | 3/1971 | Mondano | 361/220 |
| 3,781,596 | 12/1973 | Galli | 174/52 FP |
| 3,828,425 | 8/1974 | Manus | 174/52 FP |
| 3,893,193 | 7/1975 | Anazawa | 174/52 FP |
| 3,975,899 | 8/1976 | Haber | 58/23 R |
| 3,986,335 | 10/1976 | Harper | 58/23 R |
| 4,004,194 | 1/1977 | Doerflinger | 174/35 R |
| 4,037,267 | 7/1977 | Kisor | 174/52 R |
| 4,084,210 | 4/1978 | Forrest | 361/212 |
| 4,120,022 | 10/1978 | Perkins | 361/395 |

Primary Examiner—Vit W. Miska
Attorney, Agent, or Firm—Mel Sharp; Richard Donaldson; Gary C. Honeycutt

[57] ABSTRACT

Plastic housings for electronic components such as plastic cases for electronic wrist watches and calculators have their interior surfaces coated with a first layer of highly-conductive metal to provide static protection for the electronic circuitry contained in the housing, and a second metal layer overlaying the first layer to provide corrosion resistance for the first metal layer. In a preferred embodiment, the metal layers are formed by unique ion plating techniques.

12 Claims, 3 Drawing Figures

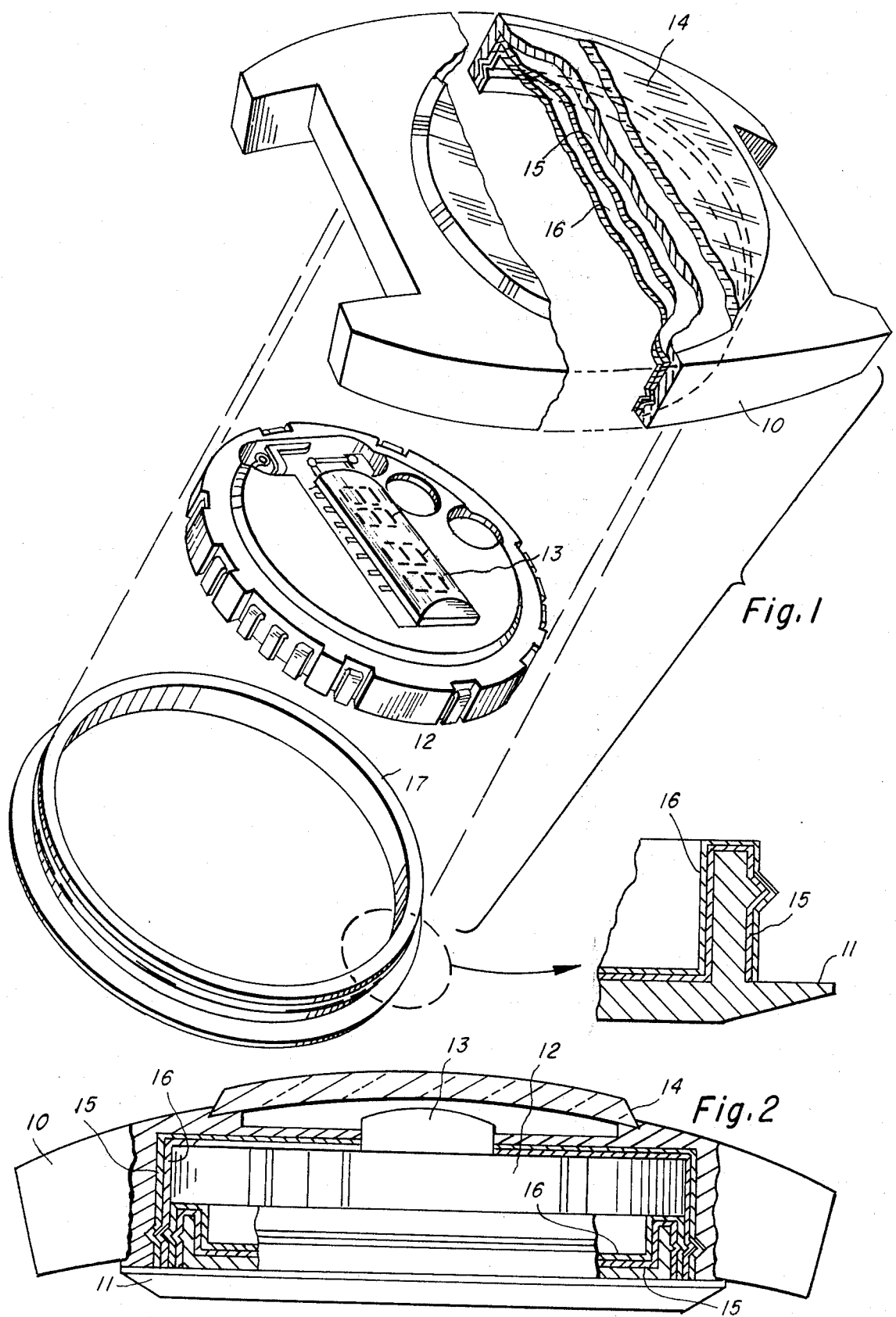

METAL-COATED PLASTIC HOUSING FOR ELECTRONIC COMPONENTS AND THE METHOD OF MAKING SAME

BACKGROUND OF THE INVENTION

This invention relates to plastic housings for electronic components, and more particularly, to such plastic housings which provide static charge protection to the electronic components. The invention further relates to a method of fabricating static charge protective plastic housings for electronic components.

It is desireable to provide low-cost housings for electronic components such as plastic cases for electronic watches and calculators. However, electronic components are subject to temporary or permanent damage caused by static charge. MOS integrated circuits, for example, are subject to permanent damage from static charge. Static charge will cause an $I^2L$ bipolar integrated circuit, on the otherhand, to lose the present information contained therein although the static charge will not normally cause permanent damage. Even so, a plastic housing would be unsuitable for electronic watches or calculators which are frequently handled, since static charge could cause inaccurate time or calculations, respectively.

It is therefore an object of the present invention to provide an improved plastic housing for electronic components.

It is another object of the invention to provide plastic housings for electronic components which protect the electronic components from static charge.

It is a further object of the invention to provide low-cost plastic housings for electronic components which protect the electronic components from static charge and yet are corrosion resistant.

Another object of the invention is to provide a method of manufacturing static charge protective plastic housings for electronic components.

Yet another object of the invention is to provide a method of fabricating static charge protective plastic housings for electronic components which housings are corrosion resistant.

It is still a further object of the invention to provide a method of fabricating plastic housings with dual-metal coatings in a single ion plating chamber.

These and other objects are accomplished in accordance with the present invention in which plastic housings for electronic components are coated with a first layer of conductive metal and overcoated with a second layer of corrosion-resistant metal. In a preferred embodiment, the housing is interiorly coated by ion plating a first layer of a low-cost, highly-conductive metal, such as copper, and then overcoated by ion plating a layer of corrosion-resistant metal, such as nickel or chrome. The copper layer provides static protection for the electronic component to be contained within the housing while the nickel layer provides chemical corrosion resistance and mechanical hardness and toughness for the copper layer. In a preferred method of fabricating the plastic housings, the plastic parts, which are formed by injection molding or some other well-known technique, are placed in an ion plating chamber containing charges of both copper and nickel in preselected amounts. During the heating cycle, the copper melts first, wets the tungsten filaments and evaporates into a plasma which is deposited on the plastic parts. The heat of evaporation and electrical conductivity of the copper hold the temperature of the filaments below that which is required to vaporize the nickel until almost all of the copper has been plated. Then, as the temperature of the filaments rise, the nickel is vaporized into the plasma and is plated onto the parts. The resulting coating starts as pure copper, then grades into almost pure nickel.

BRIEF DESCRIPTION OF THE DRAWINGS

Still further objects and advantages of the invention will become apparent from the detailed description and claims when read in conjunction with the accompanying drawings wherein:

FIG. 1 is a perspective view in explosion of an electronic watch having a plastic housing coated with a dual-metal protective system in accordance with the present invention.

FIG. 2 is a cross-sectional view of the electronic watch of FIG. 1.

DETAILED DESCRIPTION OF PREFERRED EMBODIMENTS

Figure 3:
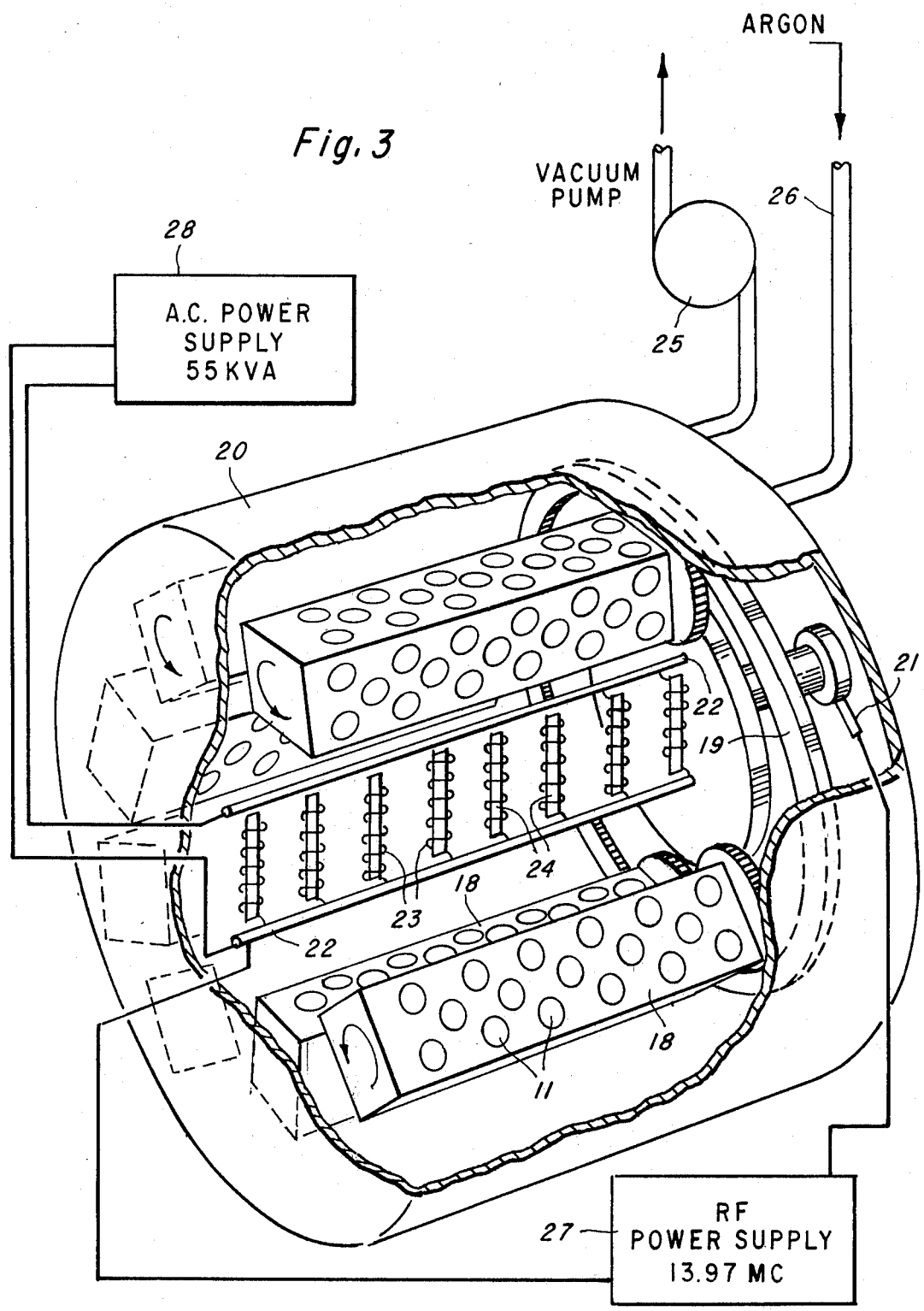

Referring then to FIGS. 1 and 2, a electronic wrist watch having a plastic housing, in accordance with the present invention, is illustrated. The wrist watch is comprised of a hollow plastic bezel member 10 and a plastic back member 11, both of which are coated on at least the interior surfaces thereof with a dual-metal coating. The undercoat layer 15 is comprised of a conductive metal such as copper which provides static charge protection to the integrated circuit (not shown) contained within the module 12. The integrated circuit is, for example, an $I^2L$ integrated circuit of the type described in U.S. Pat. No. 3,965,666, contained within module 12 in accordance with the teaching of U.S. Pat. No. 3,986,335, both of said patents being assigned to the assignee of the present invention. A display 13 is mounted on module 12 and coupled to the integrated circuit to provide a time display.

A second overcoating layer 16, comprised of a corrosion-resistant metal such as nickel or chrome, is formed over layer 15 to prevent corrosion of the copper caused by moisture, for example. Display 13, when activated may be viewed through the lens 14. Metal layers 15 and 16 extends over the edge 17 of back member 11 so that electrical contact is made with the metal coating on the interior surfaces of bezel member 10, thereby providing a complete static charge shield for the integrated circuit.

In a preferred embodiment, metal layers 15 and 16 are formed utilizing ion plating techniques, as illustrated with respect to FIG. 3. Plastic parts (eg, backs 11), which have been formed by an injection molding or some other well-known technique, are mounted in carriers 18. Carriers 18 shield all areas of the plastic parts which are not to be plated. Carriers 18 are electrically conductive and electrically isolated from chamber 20 and all other hardware within chamber 20 except comutators 21. Comutators 21 connect carriers 18 to one side of the output of a 5-KW, 13.97-MC RF power supply 27. The second side of RF power supply 27 is connected via chamber 20 to filament power bars 22. Carriers 18 are mounted on a planetary carousel 19 in such fashion that carriers 18 are rotated clockwise around the center of chamber 20 while rotating counterclockwise around their own axis.

Two large copper bars 22, located in the center of chamber 20, are connected to a 55-KVA, saturable-core reactor 28. Bars 22 carry a group (eg, 56) of tungsten filaments 23 which hold and evaporate the copper and nickel charges 24.

A preferred process of manufacturing the plastic housings will next be described in detial. Clean plastic housing member parts, such as back cover members 11, are loaded into carriers 18 which carriers are then attached to planetary carousel system 19. Solid copper (eg, 4 grams) and pure nickel (eg, 7.5 inches of 22-gauge wire) are loaded into each of the filaments 23 and the planetary system is rolled into chamber 20. Chamber 20 is then sealed and pumped down to a pressure of 0.1 microns by means of vacuum pump 25. Next, chamber 20 is backfilled with argon 26 to a pressure of between 3 and 10 microns at which level it is held during the remainder of the process. RF power supply 27 is turned on at a 50- to 5000-watt level, nominally, 1000 watts for about 5 minutes to sputter the plastic parts clean. Then, the AC power supply 28 is turned up to a level between 10 and 75 KVA, nominally, 55 KVA which is applied to filaments 23 for approximately 5 minutes to deposit the metal from charges 24 on the plastic parts. During the 5-minute heating cycle, the copper melts, wets the tungsten filaments and evaporates into a plasma from which the copper is deposited on the plastic parts. The heat of vaporization and the electrical conductivity of the copper hold the temperature of filaments 23 below that which is required to vaporize the nickel until almost all of the copper is gone. Then, as the temperature of filaments 23 rises, the nickel is vaporized into the plasma. The resulting coating starts as a layer of pure copper (eg, 2500 to 7500 angstroms, nominally 5000 angstroms in thickness) and then grades into a layer of almost pure nickel (eg, 250 to 1000 angstroms, nominally 500 angstroms in thickness).

After the nickel has been completely evaporated from filaments 23 (eg, approximately 5 minutes), power supplies 27 and 28 are turned off, the system allowed to cool and chamber 20 backfilled to 1 atmosphere to complete the cycle. Thus, in a single plating cycle, the plastic parts are coated with both the static charge protective conductive layer of copper 15 and the corrosion protective overlayer of nickel 16.

Although the two layers of different metals have been discussed with respect to a preferred embodiment, it is contemplated that a single double thickness (eg, 3500–8500 Å) layer of nickel or chrome could alternately be utilized. In addition, it should be noted that there may be more than two layers, for example, one or more metal layers may be formed between the plastic and copper or between the copper and nickel or over the nickel layer.

Various novel features of the invention have now been described in detail with respect to preferred embodiments thereof. Since it is obvious that many changes and modifications can be made in the above details without departing from the nature and spirit of the invention, it is understood that the invention is not to be limited to said details except as set forth in the amended claims.

What is claimed is:

1. A plastic container for an electronic component, said container including an interior floor surface and at least one interior wall surface upstanding from said floor surface, each of said interior floor surface and said interior wall surface having a continuous metallic coating thereon comprising a relatively thick layer of a first conductive metal next adjacent to said surface, said relatively thick layer of conductive metal grading into a relatively thin overlayer of a second corrosion resistant metal.

2. The plastic housing according to claim 1, wherein said relatively thick layer of metal is comprised of copper.

3. The plastic housing according to claim 2, wherein said relatively thic layer of metal is between 2500 and 7500 angstroms in thickness.

4. The plastic housing according to claim 1, wherein said relatively thin layer of metal is comprised of nickel.

5. The plastic housing according to claim 4, wherein said relatively thin layer is between 150 and 1000 angstroms in thickness.

6. A plastic container for an electronic component, said container including an interior floor surface and at least one interior wall surface upstanding from said floor surface, each of said interior floor surface and said interior wall surface having a continuous metallic coating theron comprising a relatively thick layer of copper next adjacent to said surface and a relatively thin overlayer comprising a corrosion resistant metal selected from the group consisting of nickel and chromium physically continguous with the copper layer and with the metallic coating on said floor surface in electrical contact with the metallic coating on said wall surface.

7. A housing for an electric wrist watch comprising: (a) a plastic bezel member having a cavity therein; and (b) a plastic back member for sealing said cavity, the walls of said cavity and the interior surface of said back member being coated with a first relatively thick underlayer of conductive metal, said first underlayer providing static charge protection for an integrated timekeeping circuit contained within said cavity, and a second relatively thin overlayer physically contiguous with the underlayer to provide a corrosion resistant protective layer for said underlayer, and wherein said underlayer and overlayer on the walls of said cavity are in electrical contact with the underlayer on the interior surface of said back member.

8. A housing for an electronic wristwatch comprising: (a) a plastic bezel member having a cavity therein; and (b) a plastic back member for sealing said cavity, the walls of said cavity and the interior surface of said back member each being coated with a continuous metallic coating comprising a relatively thick underlayer of a first conductive metal next adjacent to said surface and which grades into a relatively thin overlayer of a second corrosion-resistant metal, said underlayer providing static charge protection for an integrated timekeeping circuit contained within said cavity and said overlayer providing corrosion-resistant protection for said underlayer.

9. The housing according to claim 8, wherein a module having an electronic integrated timekeeping circuit and a display coupled to said circuit for displaying time indications is contained within said cavity.

10. The watch housing according to claim 8, wherein said relatively thin layer of metal is comprised of copper.

11. The watch housing according to claim 8, wherein said relatively thick layer of metal is comprised of nickel.

12. The watch housing according to claim 8, wherein said electronic integrated circuit is an $I^2L$ integrated circuit.

* * * * *